United States Patent [19]
Reichard

[11] Patent Number: 5,316,077
[45] Date of Patent: May 31, 1994

[54] HEAT SINK FOR ELECTRICAL CIRCUIT COMPONENTS

[75] Inventor: Jeffrey A. Reichard, Menomonee Falls, Wis.

[73] Assignee: Eaton Corporation, Cleveland, Ohio

[21] Appl. No.: 987,692

[22] Filed: Dec. 9, 1992

[51] Int. Cl.⁵ .......................................... H01L 23/473
[52] U.S. Cl. .......................... 165/104.28; 165/104.32; 165/104.33; 361/699
[58] Field of Search ............ 165/80.4, 104.33, 104.32, 165/104.28; 361/385

[56] References Cited

U.S. PATENT DOCUMENTS

| | | | |
|---|---|---|---|
| 3,327,776 | 6/1967 | Butt | 165/80.4 |
| 3,481,393 | 12/1969 | Chu . | |
| 3,817,321 | 6/1974 | von Cube et al. . | |
| 3,965,971 | 6/1976 | Roggenkamp . | |
| 4,468,717 | 8/1984 | Mathias et al. . | |
| 4,519,447 | 5/1985 | Wiech, Jr. | 165/104.33 |
| 4,620,216 | 10/1986 | Horvath . | |
| 4,847,731 | 7/1989 | Smolley | 165/104.26 |
| 4,884,168 | 11/1989 | August et al. | 165/80.4 |
| 4,941,530 | 7/1990 | Crowe | 165/104.33 |

*Primary Examiner*—Albert W. Davis, Jr.
*Attorney, Agent, or Firm*—Tarolli, Sundheim & Covell

[57] ABSTRACT

A heat sink for electrical circuit components includes a chill plate which is formed by a front plate and a back plate. The front and back plates are interconnected and cooperate to define passages for liquid coolant. Cooling fins extend from the back plate and are exposed to the atmosphere to conduct heat from the back plate. A pump is mounted on the chill plate and induces a flow of the cooling medium through passages between the front and back plates. An expansion chamber is also disposed between the front and back plates and holds gas which is compressible by the liquid cooling medium to accommodate expansion of the liquid cooling medium.

30 Claims, 4 Drawing Sheets 5,316,077

HEAT SINK FOR ELECTRICAL CIRCUIT COMPONENTS

BACKGROUND OF THE INVENTION

The present invention relates to an apparatus for use in cooling electrical circuit components and more specifically to a heat sink on which electrical circuit components may be mounted.

Electrical circuit components, such as semi-conductors and particularly power semi-conductors such as silicon controlled rectifiers or thyristors, generate substantial amounts of heat when they are used. Liquid coolant has been conducted through cooling chambers connected with the electrical circuit components. Heat is transferred from the electrical circuit components to the coolant in the cooling chambers.

The coolant is conducted from a cooling chamber to an expansion reservoir and then to a pump. The pump induces a flow of coolant through a heat exchanger. The heat exchanger has surface areas which are exposed to a flow of air to transfer heat from the coolant. The coolant is then conducted back to the cooling chambers associated with the electrical circuit components. One cooling system having this general construction is disclosed in U.S. Pat. No. 3,481,393. Other cooling systems for electrical circuit components are disclosed in U.S. Pat. Nos. 3,817,321 and 3,965,971.

Cooling systems similar to the ones disclosed in the aforementioned patents commonly utilize a system of pipes or conduits to conduct the liquid coolant between an expansion reservoir, pump, heat exchanger and cooling chambers associated with the electrical circuit components. The mounting of the expansion chamber, pump, heat exchanger and their associated piping in association with the electrical circuit components requires a substantial amount of space. In addition, after a period of use, leaks may tend to develop. Of course, any leakage of liquid coolant in association with electrical circuit components is objectionable.

SUMMARY OF THE INVENTION

The present invention relates to a new and improved apparatus which includes a chill plate. Passages for conducting a liquid cooling medium are disposed within the chill plate. A pump is mounted on the chill plate. The pump is connected in fluid communication with the passages and is operable to induce flow of the cooling medium through the passages.

A plurality of fins are connected with a side of the chill plate opposite from electrical circuit components mounted on the chill plate. The fins conduct heat away from the chill plate. An expansion chamber is disposed within the chill plate to hold a gas. The gas in the expansion chamber is compressible by the liquid cooling medium to accommodate expansion of the cooling medium.

BRIEF DESCRIPTION OF THE DRAWINGS

The foregoing and other features of the invention will become apparent upon consideration of the following description taken in connection with the accompanying drawings wherein:

FIG. 5 is an enlarged sectional view illustrating the construction of a coolant passage.

DESCRIPTION OF ONE PREFERRED EMBODIMENT OF THE INVENTION

General Description

Figure 1:
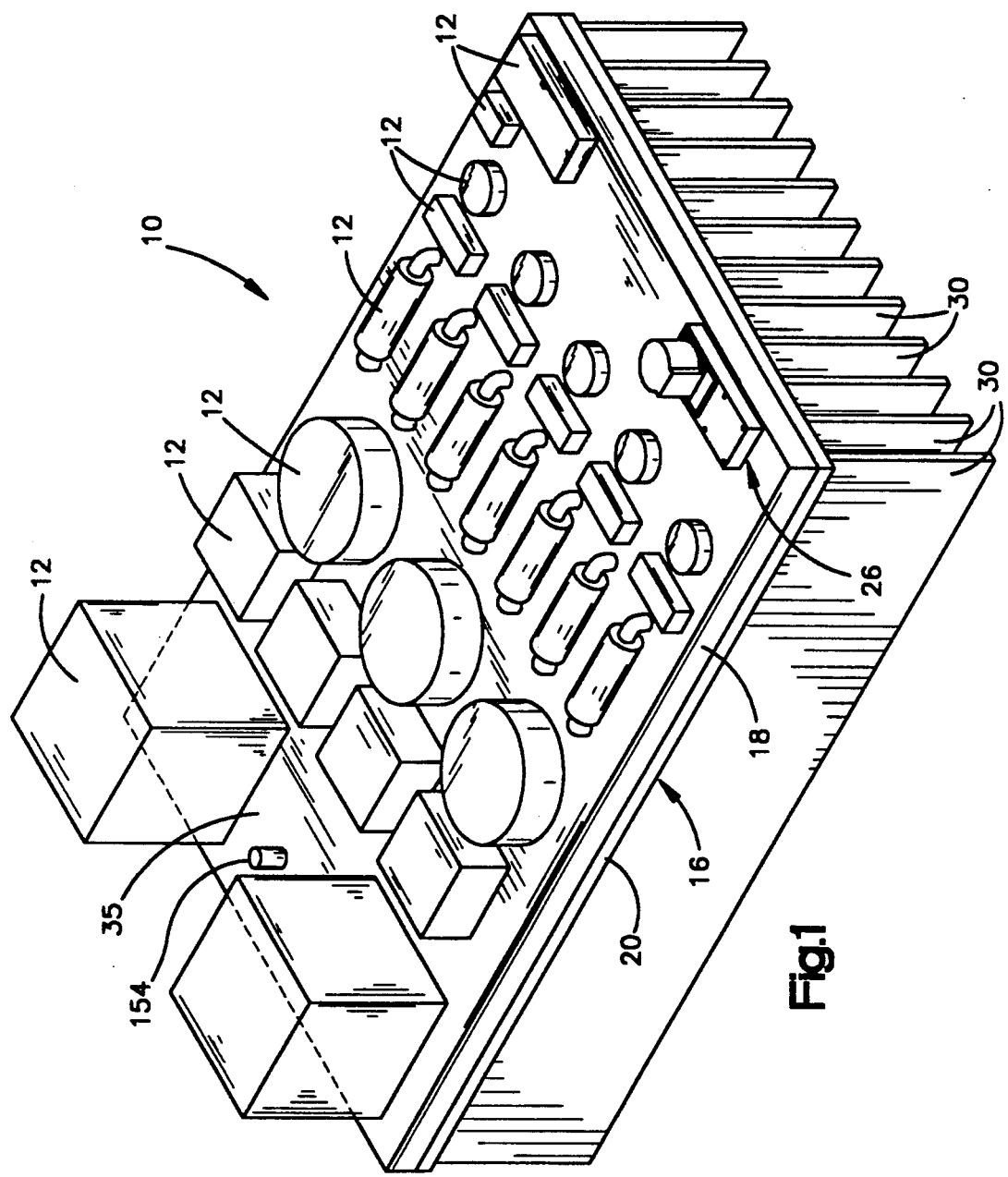
FIG. 1 is a schematic illustration depicting the relationship of a heat sink constructed in accordance with the present invention to electrical circuit components.
Figure 2:
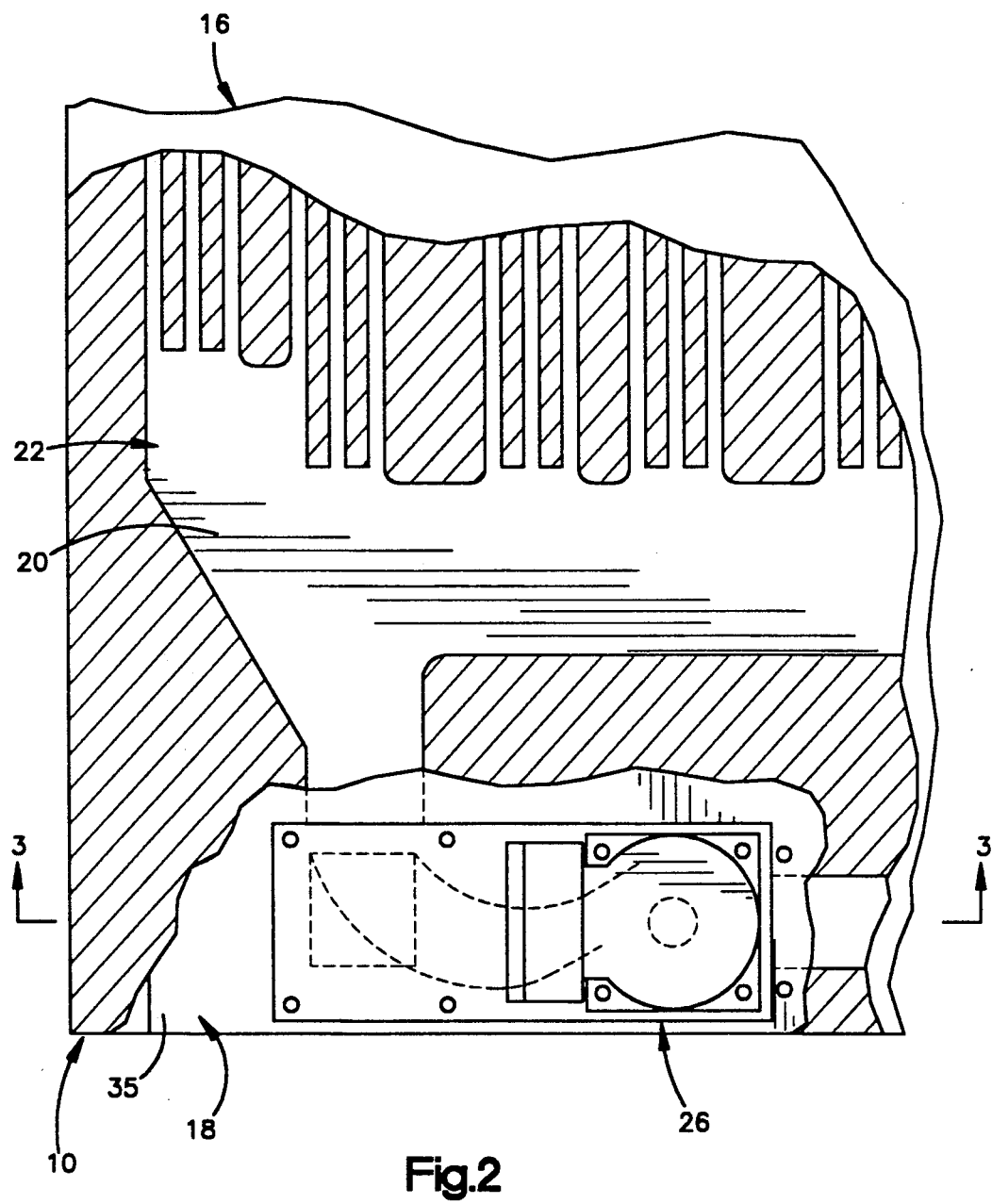
FIG. 2 is an enlarged schematic fragmentary sectional view illustrating the relationship of a pump and motor assembly to a chill plate in the heat sink of FIG. 1.
Figure 3:
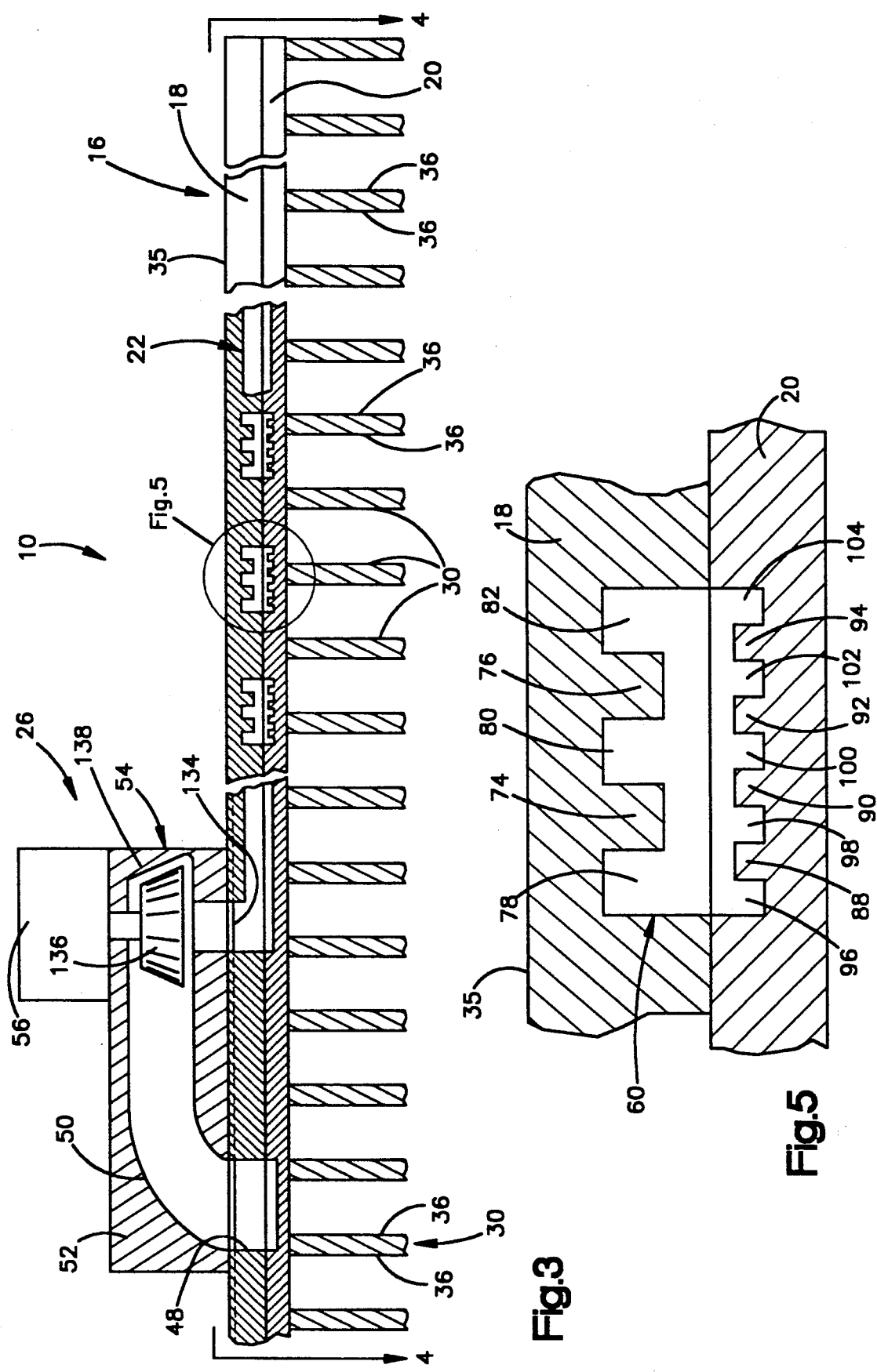
FIG. 3 is a schematic fragmentary sectional view, taken on a reduced scale along the line 3—3 of FIG. 2 and further illustrating the relationship of the pump and motor assembly to the chill plate and coolant passages within the chill plate.
Figure 4:
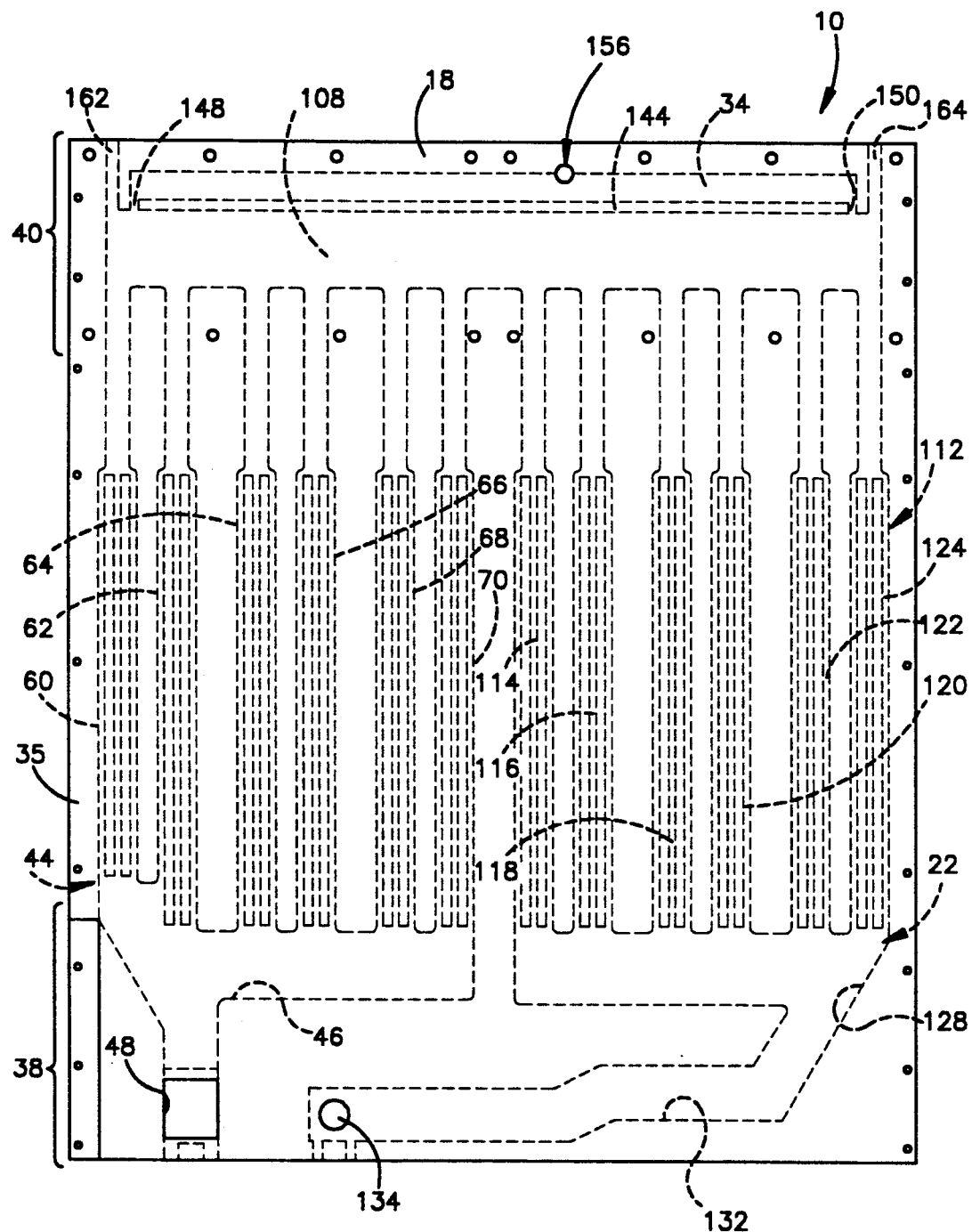
FIG. 4 is a plan view, taken on a reduced scale along the line 4—4 of FIG. 3, illustrating the construction of coolant passages and an expansion chamber in the chill plate.

A heat sink 10 (FIG. 1) is utilized to cool electrical circuit components 12. The heat sink 10 includes a chill plate 16. The chill plate 16 is formed by a front plate 18, upon which the electrical circuit components 12 are mounted, and a back plate 20. The front and back plates 18 and 20 are fixedly interconnected and cooperate to define coolant passages 22 (FIGS. 2, 3 and 4).

A pump and motor assembly 26 (FIGS. 1, 2 and 3) is mounted on the chill plate 16. The pump and motor assembly 26 is operable to cause liquid coolant to flow through the passages 22. Flow of the coolant through the passages 22 tends to equalize the temperature of the entire chill plate 16.

Cooling fins 30 (FIGS. 1 and 3) are fixedly connected with the back plate 20. The cooling fins 30 are exposed to the atmosphere, and preferably to a flow of air from a fan or other device, to transfer heat from the back plate 20 to the atmosphere.

An expansion chamber 34 (FIG. 4) is disposed within the chill plate 16 between the front plate 18 and back plate 20. The expansion chamber 34 holds a body of gas which is compressible by the liquid coolant. Compression of the gas in the expansion chamber 34 accommodates thermal expansion of the liquid coolant.

The various components of the heat sink 10 form a compact unitary module. There is no external piping for the conducting of coolant. External piping can be eliminated because the pump and motor assembly 26 are mounted on the chill plate 16, because the coolant passages 22 and expansion chamber 34 are contained within the chill plate 16, and because the heat transfer fins 30 are connected directly to the chill plate.

It is contemplated that the heat sink 10 may be used to cool electrical circuit components 12 in many different environments. However, it is believed that the heat sink 10 will be particularly advantageous when used in association with vehicles in which space is limited and the heat sink is subjected to relatively severe conditions during operation of the vehicle. Of course, the heat sink 10 may also be used with stationary apparatus.

Chill Plate—Coolant Passages

The chill plate 16 (FIG. 1) is formed by the rectangular metal front plate 18 and rectangular metal back plate 20. The front and back plates 18 and 20 are interconnected at a weld which extends around the periphery of the chill plate 16. The weld seals a joint between flat major side surfaces on the front plate 18 and back plate 20. Access to the coolant passages 22 in the chill plate 16 is provided through threaded openings formed in minor side surfaces of the front plate 18. When threaded plugs engage the openings in the front plate 18, the chill plate 16 is sealed so that liquid coolant cannot leak from within the chill plate.

It is presently preferred to interconnect the front plate 18 and back plate 20 with a suitable weld. However, it is contemplated that a seal member could be provided between the front plate 18 and back plate 20 and the two plates interconnected by fasteners, such as bolts. Regardless of how the front and back plates 18 and 20 are interconnected, the joint between the front and back plates is sealed so that liquid coolant cannot leak from within the chill plate 16.

A rectangular outer side surface 35 on the front plate 18 may be machined to form recesses for use in positioning the electrical circuit components 12 relative to the front plate. Electrical circuit components 12 are connected with the front plate 18 by suitable fasteners, such as screws. The screws extend into the front plate 18 and do not extend through the front plate to the back plate 20.

The rectangular metal fins 30 may be integrally formed with the back plate 20 or may be formed separately from the back plate. Thus, back plate 20 and fins 30 may be extruded as one piece of metal. The fins 30 have flat parallel side surfaces 36 (FIG. 3) which extend perpendicular to the major side surfaces of the front and back plates 16 and 18. If desired, the fins 30 may be formed separately from the back plate 20 and connected with the back plate. For example, slots could be provided in the back plate 20 to receive the fins 30 or the fins could be connected with a mounting plate which is secured to the back plate.

It is contemplated that the heat sink 10 will be used with the chill plate 16 in an upright orientation (FIG. 4). The coolant passages 22 conduct coolant from the lower end portion 38 of the chill plate 16 to an upper end portion 40 of the chill plate. The passages 22 then conduct the coolant from the upper end portion 40 of the chill plate back to the lower end portion 38 of the chill plate.

The coolant passages 22 include a first series 44 (FIG. 4) of passages. The first series 44 of passages have lower end portions connected with a generally horizontal inlet manifold passage 46 (FIG. 4). The inlet manifold passage 46 receives coolant from the pump and motor assembly 26 (FIG. 3) through an inlet opening 48. Thus, liquid coolant flows from a discharge passage 50 in a pump housing 52 of a pump assembly 54 through the inlet opening 48 into the inlet manifold passage 46 (FIG. 4). The pump assembly 54 is driven by an electric motor 56 (FIG. 3).

The coolant then flows upwardly into the first series 44 (FIG. 4) of passages. The first series 44 of parallel passages includes a plurality of passages 60, 62, 64, 66, 68 and 70. Each of the passages 60-70 extends vertically (as viewed in FIG. 4) upwardly from the lower end portion 38 of the chill plate 16 to the upper end portion 40 of the chill plate. The passages 22 are all formed by removing material from the front and back plates 18 and 20.

A plurality of ribs extend into each of the passages 60-70 to maximize the heat transfer area to which the liquid coolant flowing through the passages is exposed. Thus, a pair of parallel ribs 74 and 76 (FIG. 5) are formed in the front plate 18 and extend into the passage 60 to form three parallel linear channels 78, 80 and 82. Similarly four parallel ribs 88, 90, 92 and 94 are formed in the back plate 20. The ribs 88-94 form parallel linear channels 96, 98, 100, 102 and 104 in the back plate 20. There are twice as many ribs 88-94 in the back plate 20 as there are ribs 74 and 76 in the front plate 18. However, the ribs 88-94 in the back plate are half as thick as the ribs in the front plate 18.

The ribs 74 and 76 (FIG. 5) in the front plate 18 and the ribs 88-94 in the back plate 20 increase the efficiency with which heat is transferred between the front and back plates and the coolant flowing through the passage 60. Although only the passage 60 has been shown in FIG. 5, it should be understood that the passages 62, 64, 66, 68 and 70 (FIG. 4) have the same configuration as the passage 60. Of course, the front and back plates 18 and 20 could be formed with any desired number ribs in the passages 60-70. Although the use of the ribs 74, 76, 88, 90, 92 and 94 is preferred to promote heat transfer, the ribs could be eliminated if desired.

The first series of passages 44 extends vertically upwardly to a connector manifold passage 108 which extends horizontally (as viewed in FIG. 4) across the chill plate 16. The connector manifold passage 108 connects the first series 44 of passages in fluid communication with a second series 112 of passages. The second series 112 of passages includes downwardly extending vertical passages 114, 116, 118, 120, 122 and 124. The passages 114-124 extend parallel to the passages 60-70.

Each of the passages 114-124 has the same configuration as the passage 60 (FIG. 5). Thus, a plurality of ribs are formed in the front plate 18 and back plate 20 to promote a transfer of heat between the liquid coolant being conducted through the passages 114-124 (FIG. 4) and the front and back plates. The second series 112 of passages 114-124 conduct coolant downwardly from the connector manifold passage 108 to an outlet manifold passage 128 (FIG. 4).

The outlet manifold passage 128 extends generally horizontally across the lower ends of the passages 114-124 of the second series 112 of passages. The outlet manifold passage 128 has a branch or section 132 which extends to a circular outlet opening 134. Coolant is conducted from the outlet opening 134 into the pump and motor assembly 26 (FIG. 3). Thus, an impeller 136 the pump assembly 54 causes the coolant to flow to and from a pump chamber 138 in which the impeller is located. The discharge from the pump chamber 138 is conducted through the passage 50 to the inlet opening 48 in the chill plate 16.

Although it is preferred to fixedly secure the pump and motor assembly 26 on the outer side surface 35 of the front plate 18, the pump and motor assembly could be secured to the back plate 20 if desired. If this was done, a recess would be formed in the array of fins 30 (FIG. 3) to clear a portion of the outer side surface of the back plate 20 to receive the pump and motor assembly 26. The inlet and outlet openings 48 and 134 would be formed in the back plate 20.

Chill Plate—Expansion Chamber

Expansion chamber 34 (FIG. 4) holds gas (air) which is compressed to accommodate thermal expansion of the coolant liquid contained in the inlet manifold passage 46, first series of passages 44, connector manifold passage 108, second series of passages 112 and outlet manifold passage 128. The expansion chamber 34 is formed between the front and back plates 18 and 20. The expansion chamber 34 is disposed at the upper end portion 40 of the chill plate 16.

Material is removed from both the front plate 18 and the back plate 20 to form the expansion chamber 44. The expansion chamber 34 is separated from the connector manifold passage 108 by an expansion chamber wall 144 (FIG. 4). The expansion chamber wall 144 extends horizontally across the large majority of the inside of the chill plate 16. The expansion chamber wall 144 is formed by a rib which projects from the front plate 18 and a rib which projects from the back plate 20 in much the same manner as illustrated in FIG. 5 in association with the passage 60. However, the front and back plate ribs which form the expansion chamber wall 144 are disposed in abutting engagement to partially block the flow of liquid coolant from the connector manifold passage 108 into the expansion chamber 144.

A pair of passages 148 and 150 (FIG. 4) are provided at opposite ends of the expansion chamber wall 44. The passages 148 and 150 enable liquid coolant to flow into the expansion chamber 34 upon thermal expansion of the liquid coolant. However, the expansion chamber wall 144 prevents coolant flow through the connector manifold passage 108 from inducing gas to flow out of the expansion chamber 144 and into the various coolant passages.

A pressure relief valve assembly 154 (FIG. 1) is connected with the front plate 18. The pressure relief valve assembly 154 is connected with the upper end portion of the expansion chamber 34 through a passage 156 (FIG. 4) formed in the front plate 18. Upon the accumulation of excessive pressure in the expansion chamber 34, the pressure relief valve 154 is opened to vent gas (air) to the atmosphere. It should be noted that since the pressure relief valve 154 is connected with the upper end portion of the expansion chamber 156, only gas is vented to the atmosphere upon operation of the pressure relief valve. Liquid coolant is not vented to the atmosphere.

In the illustrated body of the invention, the vertical side surfaces 36 (FIG. 3) of the heat transfer fins 30 extend parallel to longitudinal central axes of the coolant passages 60–70 and 114–124 (FIG. 4). However, it is contemplated that the heat transfer fins 30 could have a different orientation if desired. For example, the heat transfer fins could have horizontal side surfaces 36 which extend perpendicular to the vertical longitudinal central axes of the coolant passages 60–70 and 114–124.

In the illustrated body of the invention, the heat sink 10 is used in an upright orientation in which the flat major side surface 35 of the chill plate 16 is vertical. This results in the expansion chamber 34 being disposed at the upper end of the chill plate 16. Therefore, gas (air) remains trapped in the expansion chamber 34 and the coolant liquid accumulates beneath the expansion chamber. However, if desired, the heat sink 10 could be orientated with the flat outer major side surface 35 of the front plate in a horizontal orientation. If this was done, the expansion chamber 34 would project upwardly by forming an upwardly extending bulge or projection in the front plate 18.

Operation

Before the heat sink 10 is to be used to cool electrical circuit components 12, the passages 22 between the front and back plates 18 and 20 are filled with a liquid coolant. The liquid coolant may be a mixture of water and antifreeze. To facilitate filling of the passages 22, a pair of fill passages 162 and 164 (FIG. 4) are formed at the upper end portion 40 of the chill plate 16. The fill passages 162 and 164 extend downwardly past the expansion chamber 34 to the connector manifold passage 108.

When the chill plate is to be filled with liquid coolant, plugs are removed from internally threaded outer end portions of the passage 162 and 164. Liquid coolant is conducted into the chill plate 16 through one of the passages 162 or 164, for example the passage 162. Gas, that is air, is conducted from the other passage, that is the passage 164. As coolant is conducted into the chill plate 16, the level of coolant rises in the coolant passages 22 and air is forced out of one of the fill passages 162 or 164. The level of coolants rises until the expansion chamber wall 144 is reached. The body of air (gas) trapped in the expansion chamber 34 above the wall 144 cannot escape. The two fill passages 162 and 164 are then plugged.

After the electrical circuit components 12 have been mounted on the chill plate 16, the chill plate is installed in association with other apparatus. During use of the electrical circuit components 12 on the chill plate 16, heat is generated. At this time, the motor 56 is operated to rotate the pump impeller 136 (FIG. 3). This forces the coolant to flow upwardly through the first series 44 (FIG. 4) of passages and to flow downwardly through the second series 112 of passages.

As the coolant flows through the passages 22 between the front plate 18 and back plate 20, heat is transferred from the front plate to the coolant. In addition, heat is transferred from the coolant to the back plate 20. Due to the flow of coolant through the passages 22, heat is conducted away from any locations where hot spots may tend to exist on the front plate 18 and is conducted to the back plate 20. As a result, there is a generally uniform heating of the front plate 18 and back plate 20.

Heat is transferred from the back plate 20 to the fins 30. A flow of air from a fan is conducted around the fins 30 to promote a transfer of heat to the air. The flow of air is then conducted away from the fins 30 to the atmosphere. This results in the electrical circuit components 12 being cooled.

In one specific embodiment of the invention, the chill plate 16 and pump assembly 26 held approximately 1.75 gallons of liquid coolant. In this embodiment of the invention, the liquid coolant was 50% antifreeze and 50% water. During operation of the motor 56, the pump 54 was effective to cause the liquid coolant to flow through the passages 22 in the chill plate 16 at a rate of approximately 10 gallons per minute. A flow of air was conducted at a rate of approximately 2,000 cubic feet per minute past the heat transfer fins 30. This resulted in the temperature of the coolant increasing at a rate of approximately 4.5° C. for each kilowatt of heat transferred from the electrical circuit components 12. In this specific embodiment of the invention, the chill plate had a vertical height of approximately 42 inches and a width of approximately 36 inches.

It should be understood that the foregoing specific dimensions and operating characteristics for the heat sink 10 have been set forth herein for purposes of clarity of description and not for purposes of limitation of the invention. Thus, it is contemplated that a heat sinks constructed in accordance with the present invention will contain different quantities of liquid coolant and this coolant may be pumped at many different rates to achieve many different heat transfer rates.

Conclusion

In view of the foregoing description, it is apparent that the present invention relates to a new and improved apparatus 10 which includes a chill plate 16. Passages 22 for conducting a liquid cooling medium are disposed within the chill plate. A pump 54 is mounted on the chill plate 16. The pump 54 is connected in fluid communication with the passages 22 and is operable to induce flow of the cooling medium through the passages.

A plurality of fins 30 are connected with a side of the chill plate opposite from electrical circuit components 12 mounted on the chill plate. The fins 30 conduct heat away from the chill plate 16. An expansion chamber 34 is disposed within the chill plate 16 to hold a gas. The gas in the expansion chamber 34 is compressible by a liquid cooling medium to accommodate expansion of the cooling medium.

Having described the invention, the following is claimed:

1. An apparatus comprising a front plate having an outer side for receiving a plurality of electrical circuit components, a back plate secured to a side of said front plate opposite from said outer side of said front plate, said front plate and said back plate cooperating to define a plurality of passages disposed between said front and back plates for conducting a cooling medium, a plurality of fins fixedly connected with said back plate and disposed on a side of said back plate opposite from said front plate for conducting heat away from said back plate, said plurality of fins being exposed to the atmosphere to enable heat to be transmitted from said plurality of fins to the atmosphere, pump means mounted on one of said front and back plates and connected in fluid communication with said passages for inducing a flow of cooling medium through said passages, means for forming an outlet opening in said one of said front and back plates and through which the cooling medium is conducted from said passages into said pump means, and means for forming an inlet opening in said one of said front and back plates and through which the cooling medium is conducted from said pump means into said passages.

2. An apparatus as set forth in claim 1 wherein said pump means includes a pump housing fixedly secured to said one of said front and back plates, said pump housing having a housing inlet which is aligned with and into which cooling medium flows from said outlet opening in said one of said front and back plates into said pump housing and a housing outlet which is aligned with and from which cooling medium flows into said inlet opening in said one of said front and back plates, said pump means including a rotatable impeller disposed in said pump housing for inducing flow of cooling medium from said housing inlet to said housing outlet.

3. An apparatus as set forth in claim 2 further including a motor connected with said pump means and mounted on said one of said front and back plates, said motor being operable to rotate an impeller in said pump means.

4. An apparatus as set forth in claim 1 wherein said cooling medium is a liquid, said front and back plates defining expansion chamber means disposed between said front and back plates and connected in fluid communication with said passages for holding a gas which is compressible by the liquid cooling medium to accommodate expansion of the liquid cooling medium.

5. An apparatus as set forth in claim 4 further including vent valve means for venting excessive gas pressure from said expansion chamber means.

6. An apparatus as set forth in claim 1 wherein said fins have end portions fixedly secured to said back plate.

7. An apparatus as set forth in claim 6 wherein said fins have major side surfaces which are generally perpendicular to said outer side of said front plate.

8. An apparatus comprising a front plate having an outer side for receiving a plurality of electrical components, a back plate secured to a side of said front plate opposite from said outer side of said front plate, said front plate and said back plate cooperating to define a plurality of passages disposed between said front and back plates for conducting a liquid cooling medium, said front plate and said back plate cooperating to define an expansion chamber disposed between said front and back plates for holding a gas which is compressible by the liquid cooling medium to accommodate expansion of the liquid cooling medium, and pump means mounted on said first end portion of one of said front and back plates for inducing a flow of liquid cooling medium in a first direction in said first series of passages and in a second direction in said second series of passages.

9. An apparatus as set forth in claim 8 wherein said plurality of passages includes a first series of passages which extends from first end portions of said front and back plates and a second series of passages which extends from said second end portions of said front and back plates to said first end portions of said front and back plates, said expansion chamber being disposed between said second end portions of said front and back plates.

10. An apparatus as set forth in claim 8 further including vent valve means mounted on said second end portion of one of said front and back plates for venting excessive pressure from said expansion chamber.

11. An apparatus as set forth in claim 8 further including a plurality of fins fixedly connected with said back plate and disposed on a side of said back plate opposite from said front plate for conducting heat away from said front plate.

12. An apparatus comprising a chill plate having an outer side and surface means for at least partially defining a plurality of passages for conducting a cooling medium, said passages being disposed inwardly of and spaced apart from said outer side of said chill plate, said outer side of said chill plate being adapted to receive a plurality of electrical circuit components from which heat is conducted by a flow of a cooling medium through said passages, and pump means mounted on said chill plate and connected in fluid communication with said passages for inducing a flow of cooling medium through said passages, said pump means including an impeller which is disposed in and is rotatable relative to a pump chamber, inlet means for conducting a flow of cooling medium from said passages to the pump chamber, and outlet means for conducting a flow of cooling medium away from the pump chamber toward said passages.

13. An apparatus as set forth in claim 12 wherein the cooling medium is a liquid, said surface means at least partially defining expansion chamber means disposed within said chill plate for holding a gas which is compressible by the liquid cooling medium to accommodate expansion of the liquid cooling medium.

14. An apparatus as set forth in claim 13 wherein said chill plate includes a front plate upon which said outer side of said chill plate is disposed and a back plate fixedly secured to said front plate and disposed on a side of said front plate opposite from said outer side, said surface means being disposed on said front and back plates, said pump means being mounted on one of said front and back plates.

15. An apparatus as set forth in claim 12 wherein said chill plate includes a front plate upon which said outer side of said chill is disposed and a back plate fixedly secured to said front plate, said plurality of passages having a first portion disposed within said front plate and a second portion disposed within said back plate.

16. An apparatus as set forth in claim 12 wherein said chill plate has parallel major sides which are interconnected by a plurality of minor sides which extend perpendicular to said major sides, said surface means for at least partially defining a plurality of passages being disposed between planes containing said major sides of said chill plate.

17. An apparatus as set forth in claim 12 wherein said chill plate includes a front plate upon which said outer side of said chill plate is disposed and a back plate secured to said front plate, said surface means being at least partially disposed on said front plate and said back plate, and a plurality of fins fixedly secured to said back plate and disposed on a side of said back plate opposite from said front plate to conduct heat away from said back plate.

18. An apparatus as set forth in claim 12 further including motor means mounted on said chill plate and connected with said impeller for rotating said impeller relative to the pump chamber.

19. An apparatus comprising a front plate having an outer side for receiving a plurality of electrical circuit components, a back plate secured to a side of said front plate opposite from said outer side of said front plate, said front plate and said back plate cooperating to define a plurality of passages disposed between said front and back plates for conducting a cooling medium, said plurality of passages including a first series of passages disposed between said front and back plates and extending from a first end portion of said front plate to a second end portion of said front plate, an inlet manifold passage connected in fluid communication with said first series of passages and disposed between said first end portion of said front plate and said back plate, a second series of passages disposed between said front and back plates and extending from the second end portion of said front plate to the first end portion of said front plate, a connector manifold passage connected in fluid communication with said first and second series of passages and disposed between said second end portion of said front plate and said back plate, and an outlet manifold passage connected in fluid communication with said second series of passages and disposed between said first end portion of said front plate and said back plate, and pump means mounted on one of said front and back plates for inducing a flow of cooling medium from said outlet manifold passage through said pump means to said inlet manifold passage, for inducing a flow of a cooling medium from said inlet manifold passage through said first series of passages to said connector manifold passage, and for inducing a flow of cooling medium from said connector manifold passage through said second series of passages to said outlet manifold passage.

20. An apparatus as set forth in claim 19 wherein the cooling medium is a liquid, said second end portion of said front plate and said back plate defining expansion chamber means disposed between said front and back plates and connected in fluid communication with said connector manifold passage for holding a gas which is compressible by the liquid cooling medium to accommodate expansion of the liquid cooling medium.

21. An apparatus as set forth in claim 20 further including vent valve means connected with the second end portion of said front plate for venting excessive gas pressure from said expansion chamber means.

22. An apparatus as set forth in claim 19 further including a plurality of fins fixedly connected with said back plate and disposed on a side of said back plate opposite from said front plate for conducting heat away from said back plate.

23. An apparatus as set forth in claim 22 wherein said plurality of fins are exposed to the atmosphere to enable heat to be transmitted from said plurality of fins to the atmosphere.

24. An apparatus comprising a front plate having an outer side for receiving a plurality of electrical components, and a back plate secured to a side of said front plate opposite from said outer side of said front plate, said front plate and said back plate cooperating to define a plurality of passages disposed between said front and back plates for conducting a liquid cooling medium, said front plate and said back plate cooperating to define an expansion chamber disposed between said front and back plates for holding a gas which is compressible by the liquid cooling medium to accommodate expansion of the liquid cooling medium, said plurality of passages including an inlet manifold passage disposed between first end portions of said front and back plates and having a first length, a connector manifold passage disposed between second end portions of said front and back plates and having a second length which is greater than said first length, an outlet manifold passage disposed between the first end portions of said front and back plates and having a third length which is less than said second length, a first series of passages disposed between said front and back plates and extending from said inlet manifold passage to said connector manifold passage for conducting liquid cooling medium from said inlet manifold passage to said connector manifold passage, a second series of passages disposed between said front and back plates and extending from said connector manifold passage to said outlet manifold passage for conducting liquid cooling medium from said connector manifold passage to said outlet manifold passage, said expansion chamber being disposed between the second end portions of said front and back plates and having a length which is greater than said first and third lengths.

25. An apparatus as set forth in claim 24 wherein said inlet manifold passage, connector manifold passage, outlet manifold passage, and expansion chamber have parallel longitudinal axes.

26. An apparatus as set forth in claim 24 further including a first passage interconnecting a first end portion of said expansion chamber and said connector manifold passage and a second passage interconnecting a second end portion of said expansion chamber and said connector manifold passage, said first and second passages being separated by a distance which is greater than said first and third lengths.

27. An apparatus as set forth in claim 24 further including wall means for separating said connector manifold passage from said expansion chamber, said wall means being formed by a first rib which extends from said front plate toward said back plate and a second rib which extends from said back plate toward said front plate.

28. An apparatus as set forth in claim 24 further including a vent valve mounted on the second end portion of one of said front and back plates for venting excessive pressure from said expansion chamber.

29. An apparatus as set forth in claim 24 further including pump means mounted on one of said front and back plates for inducing a flow of liquid cooling medium from said outlet manifold passage to said inlet manifold passage, and motor means connected with said pump means for driving said pump means to induce a flow of liquid cooling medium.

30. An apparatus comprising chill plate means for conducting heat away from electrical circuitry which generates heat and is on said chill plate means, passage means disposed within said chill plate means for holding liquid to which heat is transferred from said chill plate means, pump means mounted on said chill plate means for inducing a flow of liquid through said passage means within said chill plate means to promote a uniform dissipation of heat from said chill plate means, motor means mounted on said chill plate means for driving said pump means, expansion chamber means disposed within said chill plate means for holding gas which is compressible by the liquid to accommodate thermal expansion of the liquid, and a plurality of fins extending from said chill plate means to promote a transfer of heat from said chill plate means to an atmosphere around said chill plate means.

* * * * *

UNITED STATES PATENT AND TRADEMARK OFFICE
CERTIFICATE OF CORRECTION

PATENT NO. : 5,316,077

DATED : May 31, 1994

INVENTOR(S) : Jeffrey A. Reichard

It is certified that error appears in the above-identified patent and that said Letters Patent is hereby corrected as shown below:

Column 8, line 29, after "plates" insert --to second end portions of said front and back plates--.

Signed and Sealed this

Eleventh Day of October, 1994

Attest:

BRUCE LEHMAN

*Attesting Officer*    *Commissioner of Patents and Trademarks*